(12) United States Patent
Chung

(10) Patent No.: US 6,921,968 B2
(45) Date of Patent: Jul. 26, 2005

(54) STACKED FLIP CHIP PACKAGE

(75) Inventor: Chih-Ming Chung, Kaohsiung (TW)

(73) Assignee: Advance Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 10/834,936

(22) Filed: Apr. 30, 2004

(65) Prior Publication Data

US 2004/0217485 A1 Nov. 4, 2004

(30) Foreign Application Priority Data

May 2, 2003 (CN) .......................................... 92112183 A

(51) Int. Cl.⁷ .......................... H01L 23/02; H01L 23/48
(52) U.S. Cl. ........................ 257/686; 257/777; 257/778; 257/796
(58) Field of Search ............................... 257/685–686, 257/738, 777, 778, 782, 784, 787, 796

(56) References Cited

U.S. PATENT DOCUMENTS

| | | | | | |
|---|---|---|---|---|---|
| 5,776,512 A | * | 7/1998 | Weber | ........................ | 425/116 |
| 5,817,530 A | * | 10/1998 | Ball | ........................... | 117/56 |
| 5,886,412 A | * | 3/1999 | Fogal et al. | ................. | 257/777 |
| 5,973,406 A | * | 10/1999 | Harada et al. | ............... | 257/780 |
| 6,005,778 A | * | 12/1999 | Spielberger et al. | ........ | 361/770 |
| 6,051,886 A | * | 4/2000 | Fogal et al. | ................. | 257/777 |
| 6,057,598 A | | 5/2000 | Payne et al. | ................. | 257/723 |
| 6,080,264 A | * | 6/2000 | Ball | ........................... | 156/292 |
| 6,686,223 B2 | * | 2/2004 | Uchida | ........................ | 438/108 |
| 6,737,750 B1 | * | 5/2004 | Hoffman et al. | ............ | 257/777 |
| 6,759,737 B2 | * | 7/2004 | Seo et al. | .................... | 257/686 |
| 6,798,049 B1 | * | 9/2004 | Shin et al. | ................... | 257/678 |

FOREIGN PATENT DOCUMENTS

| | | |
|---|---|---|
| CN | TW461058 | 10/2001 |
| CN | TW465803 | 11/2001 |

* cited by examiner

*Primary Examiner*—Ori Nadav
(74) *Attorney, Agent, or Firm*—Troxell Law Office, PLLC

(57) ABSTRACT

A stacked flip-chip package comprises a substrate having an opening, a back-to-face chip module, and an encapsulant. The back-to-face chip module is attached to the substrate and encapsulated by the encapsulant. The back-to-face chip module includes a first chip and a second chip. The first chip has a first active surface and a first back surface. Redistributed traces are formed on the first back surface. The second chip is flip-chip mounted on the first back surface of the first chip and electrically connected to the redistributed traces. A plurality of bumps connect the redistributed traces to the top surface of the substrate. Thus the second chip can be accommodated inside the opening and the redistributed traces are electrically connected to the second chip and the substrate so as to achieve fine pitch flip-chip mounting and improve the electrical performance and heat dissipation efficiency for the back-to-face chip module.

7 Claims, 2 Drawing Sheets

STACKED FLIP CHIP PACKAGE

FIELD OF THE INVENTION

The present invention generally relates to a stacked flip-chip package, more particularly to a back-to-face stacked flip-chip package for improving electrical performance and heat-dissipation efficiency.

BACKGROUND OF THE INVENTION

In conventional multi-chip flip-chip package, a plurality of semiconductor chips are requested to flip-chip mount on a substrate. As disclosed in R.O.C. Taiwan Patent No. 465,803 entitled "multi-chip stacked structure", a plurality of chips are flip-chip mounted on the top surface and on the bottom surface of the substrate respectively. Since the active surfaces of the chips are turned upside down to face the substrate for bumps connection, therefore, the substrate should be larger enough to provide flip-chip mounting areas for the bumped chips since the bumped chips can not vertically stack on a substrate.

Referring to FIG. 1, a conventional stacked flip-chip package 100 has a face-to-face flip-chip connection. The package 100 comprises a substrate 110, a first chip 120, a second chip 130, and a molding compound 170. The back surface 122 of the first chip 120 is attached to the top surface 111 of the substrate 110 by die-attach material. A plurality of bonding pads 123 and a plurality of redistributed traces 124 are formed on the active surface 121 of the first chip 120. The second chip 130 has a plurality of bumps 140 on its active surface 131. The second chip 130 is flip-chip mounted on the active surface 121 of the first chip 120 via the bumps 140 to electrically connect to the redistributed traces 124. An under-filling material 160 is applied between the active surface 131 of the second chip 130 and the active surface 121 of the first chip 120 to encapsulate the bumps 140. The bonding pads 123 of the first chip 120 and the redistributed traces 124 are electrically connected to the substrate 110 via a plurality of bonding wires 150. An encapsulant 170 is formed on the top surface 111 of the substrate 110 to encapsulate the first chip 120 and the second chip 130 and the bonding wires 150. Besides, a plurality of solder balls 180 are placed on the bottom surface 112 of the substrate 110. When the package 100 is in operation, the heat generated from the first chip 120 and the second chip 130 will accumulate between the first chip 120 and the second chip 130, which can not be easily dissipated. Furthermore, since the plurality of bonding pads 123 and a plurality of redistributed traces 124 are designed on the active surface 121 of the first chip 120, the redistributed traces 124 become quite complicated and jammed. The bonding pads 123 and the wire-connecting pads of the redistributed traces 124 can only be designed at the periphery of the active surface 121, therefore, the electrical performance will be reduced. The conventional stacked face-to-face flip-chip packages similar to the package 100 mentioned above have been disclosed also in U.S. Pat. No. 6,057,598 and R.O.C. Taiwan Patent No. 461,058.

SUMMARY

The main purpose of the present invention is to provide a stacked flip-chip package. A back-to-face chip module is attached to a substrate having an opening. In the back-to-face chip module, a first chip has a plurality of redistributed traces formed on its back surface, a second chip is flip-chip mounted on the back surface of the first chip to be electrically connected to the redistributed traces. The second chip is further electrically connected to the substrate via bumps formed at the periphery of the back surface of the first chip without passing through the active surface of the first chip, so that the electrical performance can be enhanced due to a shorter electrical path.

The secondary purpose of the present invention is to provide a stacked flip-chip package. A back-to-face chip module is attached to a substrate having an opening. The back-to-face chip module includes a first chip having a plurality of redistributed traces on the back surface and a second chip flip-chip mounted on the back surface of the first chip. Accordingly, the heat generated from the active surface of the second chip is far away from the active surface of the first chip and is conducted to the substrate via bumps at the periphery of the back surface of the first chip to improve heat dissipation efficiency of the stacked flip-chip package.

The third purpose of the present invention is to provide a stacked flip-chip package. A back-to-face chip module includes a first chip and a second chip. The second chip is flip-chip mounted on the back surface of the first chip, and is connected to a substrate via bumps. The substrate has an opening having a dimension larger than the second chip and smaller than the first chip. When the back-to-face chip module is attached to the top surface of the substrate, the second chip is accommodated inside the opening of the substrate so as to reduce the thickness of the multi-chip stacked flip-chip package.

According to the present invention, a stacked flip-chip package comprises a substrate, a back-to-face chip module and an encapsulant. The substrate has a top surface, a bottom surface, and an opening. The back-to-face chip module includes a first chip and a second chip. The first chip has the first active surface, the first back surface, a plurality of the first bonding pads on the first active surface, and a plurality of redistributed traces on the first back surface. The first bonding pads of the first chip can be electrically connected to the top surface of the substrate by bonding wires. The second chip is flip-chip mounted on the first back surface of the first chip to connect to the redistributed traces. The second chip has the second active surface, the second back surface and a plurality of the second bonding pads on the second active surface. The back-to-face chip module is attached to the top surface of the substrate by bump connection. A plurality of bumps is formed at the periphery of the first back surface for electrically connecting the redistributed traces to the top surface of the substrate. The second chip is accommodated inside the opening of the substrate. The encapsulant is formed on the top surface of the substrate to encapsulate the back-to-face chip module.

DETAILED DESCRIPTION OF THE PRESENT INVENTION

Figure 1:
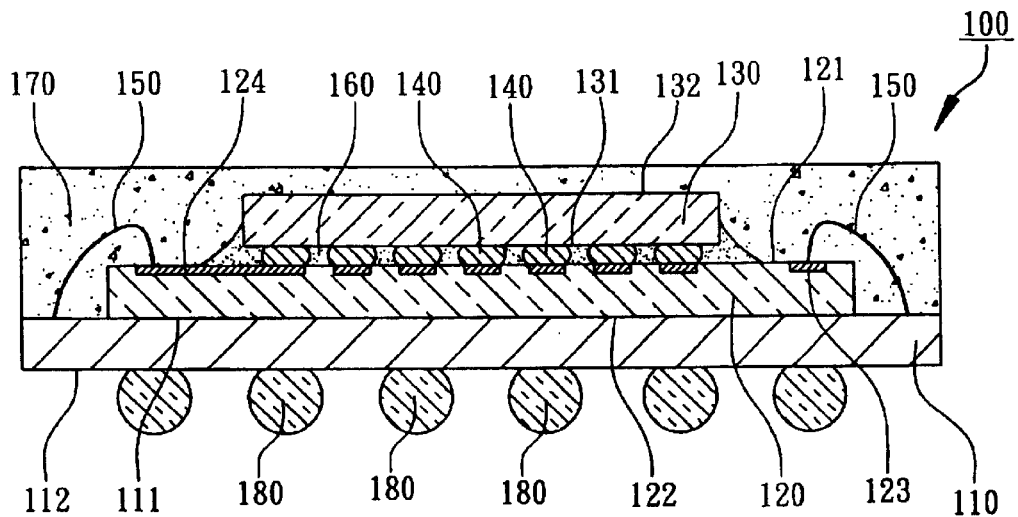
FIG. 1 is a cross-sectional view of a conventional face-to-face flip-chip package.

Referring to the drawings attached, the present invention will be described by means of the embodiments below.

Figure 2:
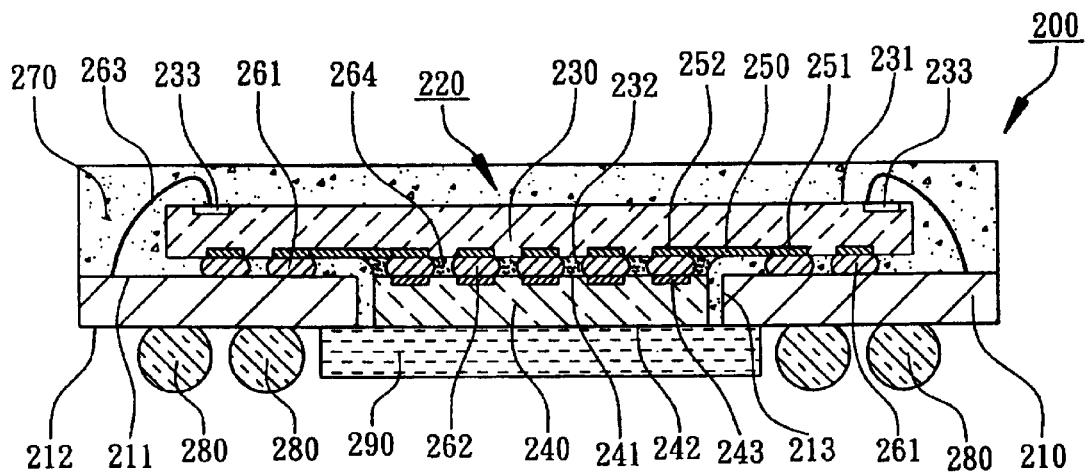
FIG. 2 is a cross-sectional view of a stacked flip-chip package in accordance with the first embodiment of the present invention.

According to the first embodiment of the present invention, as showed in FIG. 2, a stacked flip-chip package 200 comprises a substrate 210, a back-to-face chip module 220 and an encapsulant 270. The substrate 210 is used to support the back-to-face chip module 220, which has a top surface 211, a bottom surface 212 and an opening 213 through the top surface 211 and a bottom surface 212. The substrate 210 can be a printed wiring board of BT resin, FR-4 resin or FR-5 resin or the other wiring board materials.

The back-to-face chip module 220 is attached to the top surface 211 of the substrate 210 and includes a first chip 230 and a second chip 240. The first chip 230 is a chip with a larger dimension, such as microprocessors, microcontrollers, memory chips, or ASIC. The first chip 230 has the first active surface 231 with a plurality of the first bonding pads 233 and an opposing first back surface 232 with a plurality of redistributed traces 250 made by conventional integrated circuit fabrication processes. Whereas the second chip 240 is a chip with a smaller dimension than that of the first chip 230 and has the second active surface 241 with a plurality of the second bonding pads 243 and the second back surface 242. The redistributed traces 250 formed on the first back surface 232 have a plurality of first bumping pads 251 and a plurality of the second bumping pads 252. The first bumping pads 251 are formed at the periphery of the first back surface 232 of the first chip 230 in fan-out arrangement for electrically connection to the substrate 210. The second bumping pads 252 are corresponding to the second bonding pads 243 of the second chip 240 and are formed on the center of the first back surface 232 of the first chip 230 in fan-in arrangement. Accordingly, the pitch between two adjacent second bumping pads 252 is smaller than that between two adjacent first bumping pads 251. The first bumping pads 251 are electrically connected to the second bumping pads 252 by the redistributed traces 250 on the first back surface 232 of the first chip 230 without changing the arrangement of the first bonding pads 233 on the first active surface 231 of the first chip 230. A plurality of first bumps 261 are placed at the periphery of the first back surface 232 to connect the first bumping pads 251 of the redistributed traces 250 to the top surface 211 of the substrate 210. Since a plurality of second bumps 262 are formed on the second bumping pads 252 or the second bonding pads 243, the second chip 240 can be flip-chip mounting on the first back surface 232 of the first chip 230 to be electrically connected the redistributed traces 250. Preferably, the first bumps 261 and the second bumps 262 are solder bumps. When the first bumps 261 are re-flowed, the back-to-face chip module 220 is attached to the top surface 211 of the substrate 210 in a manner that the first bumping pads 251 are electrically connected to the top surface 211 of the substrate 210 and the second chip 240 is accommodated inside the opening 213. Using the redistributed traces 250 on the first back surface 232 and the first bumps 261, the, second chip 230 is electrically connected to the substrate 210 with better heat dissipation and a thinner profile. Furthermore, the redistributed traces 250 connecting the first bumping pads 251 and the second bumping pads 252 are manufactured by IC processes. The pitch of the second bumping pads 252 can match that of the second bonding pads 243 of the second chip 240. There is no thermal stress between the second chip 240 and the first chip 230. Due to the back-to-face flip-chip mounting, the second active surface 241 of the second chip 240 is attached to the first back surface 232 of the first chip 230 so that the second active surface 241 of the second chip 240 is far away from the first active surface 231 of the first chip 230. Therefore, the heat generated from the second chip 240 is easily conducted to the substrate 210 via the first bumps 261 and the second bumps 262 and the redistributed traces 250. Preferably, an under-filling material 264 is applied between the first back surface 232 of the first chip 230 and the second active surface 241 of the second chip 240 in order to encapsulate the second bumps 262.

According to the first embodiment of the present invention, the opening 213 of the substrate 210 has a dimension smaller than the first chip 230 and larger than the second chip 240. When the back-to-face chip module 220 is attached to the top surface 211 of the substrate 210 using the plurality of first bumps 261, the second chip 240 is accommodated inside the opening 213 so that the thickness of the stacked flip-chip package 200 can be effectively reduced. The first bumps 261 mechanically bond the back-to-face chip module 220 to the substrate 210 and electrically connect the second chip 240 to the substrate 210 via the redistributed traces 250. A plurality of the bonding wires 263 or other connecting components are used for electrically connecting the first bonding pads 233 of the first chip 230 to the top surface 211 of the substrate 210. Then, the encapsulant 270 is formed on the top surface 211 of the substrate 210 to encapsulate and protect the back-to-face chip module 220. Also a plurality of solder balls 280 are placed on the bottom surface 212 of the substrate 210 to form a ball grid array (BGA) multi-chip package. In this embodiment, the second back surface 242 is exposed out of the bottom surface 212 of the substrate 210. It is preferable that a heat sink 290 is attached to the second back surface 242 of the second chip 240. Since the heat sink 290 is larger than the second chip 240 and the opening 213, the heat sink 290 can be attached to the bottom surface 212 of the substrate 210 to cover the opening 213. Thus another heat-dissipating path of the back-to-face chip module 220 without conducting the heat via the first bumps 261 and the second bump 262 is provided for improving heat-dissipation efficiency. Moreover, the second chip 240 of the back-to-face chip module 220 is electrically connected to the substrate 210 through the redistributed traces 250 on the first back surface 232 and the bumps 261 and 262 without passing through the first active surface 231 of the first chip 230 nor the bonding wires 263. Therefore, the stacked flip-chip package 200 of the present invention provides a shorter electrical path for better electrical performance.

Figure 3:
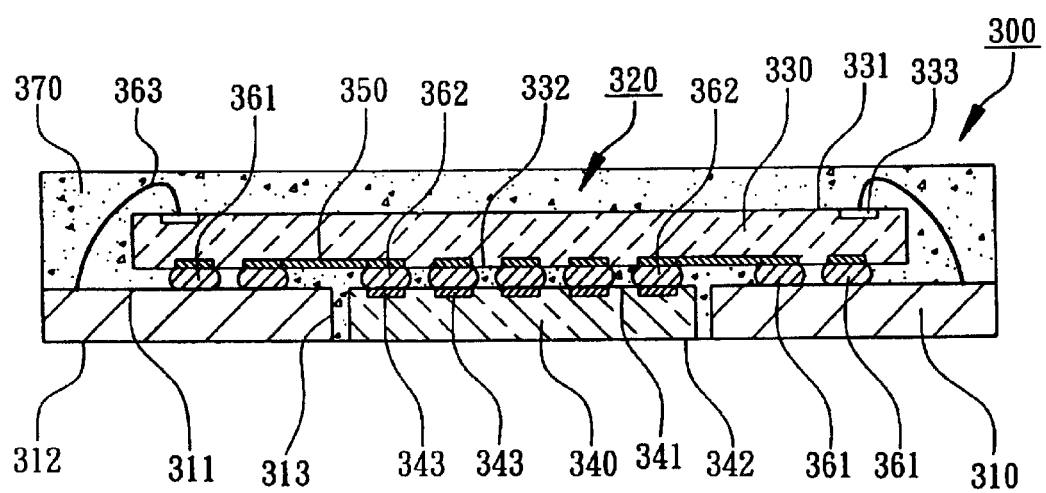
FIG. 3 is a cross-sectional view of a stacked flip-chip package in accordance with the second embodiment of the present invention.

In the second embodiment of the present invention, another package similar to the stacked flip-chip package 200 mentioned above is showed in FIG. 3. A stacked flip-chip package 300 comprises a substrate 310, a back-to-face chip module 320 and an encapsulant 370. The back-to-face chip module 320 includes a first chip 330 and at least a second chip 340, and is attached to the top surface 311 of the substrate 310 by bump connection or ACF (anisotropic conductive film) connection. A plurality of redistributed traces 350 are formed on the first back surface 332 of the first chip 330 and have a plurality of the first bumps 361 and the second bumps 362 at the periphery and on the center of the first back surface 332 of the first chip 330 respectively. The second chip 340 is flip-chip mounted to the first back surface 332 of the first chip 330 so that the second active surface 341 of the second chip 340 facing to the first back surface 332 of the first chip 330. The second bumps 362 on the redistributed traces.350 connect the bonding pads 343 of the second chip 340. When the back-to-face chip module 320 is attached to the substrate 310 using the first bumps 361 or ACF (not shown in the figure), the second chip 340 electrically connected to the substrate 310 can be accommodated inside the opening 313 of the substrate 310 where the opening 313 is used as a chip cavity. Alternatively, the back-to-face chip module 320 can be directly attached to the substrate 310 by closely positioning the second chip 340 inside the opening 313 of the substrate 310. In this embodiment, the opening 313 passes through the top surface 311 and the bottom surface 312 of the substrate 310 so that the second back surface 342 of the second chip 340 will be exposed out of the bottom surface 312 of the substrate 310 to improve the heat-dissipation and reduce the package thickness. Furthermore, the bonding pads 333 of the first chip 330 are electrically connected to the substrate 310 through the bonding wires 363 or other electrically connecting components (such as TAB leads). Since the second chip 340 is electrically connected to the substrate 310 via the redistributed traces 350 on the first back surface 332 and the bumps 361, 362, the second chip 340 has a shorter path of electrical connection to the substrate 310 without affecting the arrangement of the bonding pads 333 of the first chip 330 so as to improve the electrical performance of the package 300. The above description of embodiments of this invention is intended to be illustrated and not limited. Other embodiments of this invention will be obvious to those skilled in the art in view of the above disclosure.

What is claimed is:

1. A stacked flip-chip package comprising:
   a substrate having a top surface, a bottom surface and an opening;
   a back-to-face chip module including a first chip and a second chip, wherein the first chip has a first active surface, a first back surface, and a plurality of first bonding pads, the second chip has a second active surface, a second back surface, and a plurality of second bonding pads, a plurality of redistributed traces are formed on the first back surface of the first chip and have a plurality of first bumping pads and a plurality of second bumping pads, the first bumping pads are formed at the periphery of the first back surface of the first chip in fan-out arrangement, the second bumping pads are formed on the center of the first back surface of the first chip in fan-in arrangement, the second chip is flip-chip mounted on the first back surface of the first chip so that the second bonding pads are electrically connected to the second bumping pads, the back-to-face chi module is attached to the top surface of the substrate in a manner that the first bumping pads are electrically connected to the top surface of the substrate and the second chip is accommodated inside the opening; and an encapsulant formed on the top surface of the substrate to encapsulate the back-to-face chip module.

2. The package in accordance with claim 1, wherein the second back surface is exposed out of the bottom surface of the substrate.

3. The package in accordance with claim 2, further comprising a heat sink attached to the second back surface of the second chip.

4. The package in accordance with claim 3, wherein the heat sink is connected to the bottom surface of the substrate to cover the opening.

5. The package in accordance with claim 1, further comprising a plurality of solder balls placed on the bottom surface of the substrate.

6. The package in accordance with claim 1, further comprising an under-filling material between the first back surface of the first chip and the second active surface of the second chip.

7. The package in accordance with claim 1, further comprising a plurality of bonding wires connecting the first bonding pads to the substrate.

* * * * *